(12) United States Patent
Zhu

(10) Patent No.: US 11,862,495 B2
(45) Date of Patent: Jan. 2, 2024

(54) MONITOR WAFER MEASURING METHOD AND MEASURING APPARATUS

(71) Applicant: CHANGXIN MEMORY TECHNOLOGIES, INC., Hefei (CN)

(72) Inventor: He Zhu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 179 days.

(21) Appl. No.: 17/598,807

(22) PCT Filed: Jun. 16, 2021

(86) PCT No.: PCT/CN2021/100249
§ 371 (c)(1),
(2) Date: Sep. 27, 2021

(87) PCT Pub. No.: WO2022/160564
PCT Pub. Date: Aug. 4, 2022

(65) Prior Publication Data
US 2022/0406636 A1 Dec. 22, 2022

(30) Foreign Application Priority Data
Jan. 27, 2021 (CN) .......................... 202110108391.9

(51) Int. Cl.
*G01R 31/28* (2006.01)
*H01L 21/67* (2006.01)
*G01B 11/27* (2006.01)

(52) U.S. Cl.
CPC ........ *H01L 21/67259* (2013.01); *G01B 11/27* (2013.01); *G01R 31/2893* (2013.01)

(58) Field of Classification Search
CPC .... G01B 11/27; G01R 31/28; G01R 31/2893; H01L 21/67; H01L 21/67242;
(Continued)

(56) References Cited

U.S. PATENT DOCUMENTS

2013/0230798 A1\* 9/2013 Maeda ................ G03F 7/70641
430/30
2018/0114712 A1 4/2018 Hung et al.
2018/0299266 A1\* 10/2018 Chen ...................... G01N 23/02

FOREIGN PATENT DOCUMENTS

CN 102721873 A 10/2012
CN 104900553 A 9/2015
(Continued)

OTHER PUBLICATIONS

International Search Report and Written Opinion as cited in PCT/CN2021/100249 dated Oct. 26, 2021, 10 pages.

*Primary Examiner* — Jermele M Hollington
*Assistant Examiner* — Courtney G Mcdonnough
(74) *Attorney, Agent, or Firm* — Cooper Legal Group, LLC

(57) ABSTRACT

The present invention relates to a monitor wafer measuring method and measuring apparatus. The monitor wafer measuring method comprises the following steps: fixing a product wafer, the product wafer having several alignment marks and product measuring sites corresponding respectively to the alignment marks; determining the product measuring sites according to the alignment marks; and placing a monitor wafer, a projection of the monitor wafer in a vertical direction being aligned with and coinciding with the product wafer. The present application can reduce or even eliminate positional errors of the monitor wafer during a measurement process, such that product-level measuring position accuracy can be achieved for the monitor wafer and further, the measuring machine itself and process changes can be monitored in a better way.

11 Claims, 1 Drawing Sheet

(58) Field of Classification Search
CPC ......... H01L 21/67259; H01L 21/67294; H01L 21/68; G03F 7/70616
USPC .................................................. 324/750.23
See application file for complete search history.

(56) References Cited

FOREIGN PATENT DOCUMENTS

| | | |
|---|---|---|
| CN | 105244305 A | 1/2016 |
| CN | 111933541 A | 11/2020 |
| CN | 112908898 A | 6/2021 |

* cited by examiner

MONITOR WAFER MEASURING METHOD AND MEASURING APPARATUS

CROSS-REFERENCE TO RELATED APPLICATIONS

This application claims priority to and benefits of Chinese Patent Application No. 202110108391.9 entitled "MONITOR WAFER MEASURING METHOD AND MEASURING APPARATUS", filed on Jan. 27, 2021, which is incorporated herein by reference in its entirety.

TECHNICAL FIELD

The present application relates to the field of semiconductor manufacturing technologies, and in particular to a monitor wafer measuring method and measuring apparatus.

BACKGROUND

During a semiconductor process, a measuring machine serves to measure the parameters, such as feature size, of patterns in a semiconductor structure. Traditional measuring methods involve placing a wafer to be measured on a measuring apparatus by means of a conveying structure like a robotic arm, and then moving the wafer to be measured to a particular measuring position inside the measuring apparatus through a moving unit inside the measuring apparatus, followed by measurement at the particular measuring position.

Errors in hundreds of micrometers, however, may occur when the wafer to be measured is moved by the moving unit. In order to compensate for and calibrate these errors, the currently employed method is to define various marking graphics in the wafer to be measured, and compensate for, by identifying the marking graphics, movement errors generated by the moving unit, so as to ensure the accuracy of final measurement sites.

A monitor wafer is a silicon wafer utilized to monitor machine performances during the semiconductor process. When the monitor wafer is utilized to monitor the performances of the measuring apparatus, the monitor wafer is conveyed onto the measuring apparatus by the conveying structure like the robotic arm and subsequently moved directly to the particular measuring position by the moving unit inside the measuring apparatus. The monitor wafer has on its surface merely a single film layer without any marking graphic, so the movement errors generated during movement of the monitor wafer cannot be compensated for by graphics identification and yet, only the stability of the machine itself can be relied upon.

Therefore, it is a technical problem to be solved urgently at present that how the accuracy of the monitor wafer at the measuring position inside the measuring apparatus is improved and thus the machine and the process are monitored in a better way.

SUMMARY

The present application provides a monitor wafer measuring method and measuring apparatus to resolve the problem in the prior art that the monitor wafer has low accuracy at the measuring position inside the measuring apparatus, and further to monitor the machine and the process in a better way.

To solve the above-mentioned problem, provided in the present application is a monitor wafer measuring method, including the following steps:
fixing a product wafer, the product wafer having several alignment marks and product measuring sites corresponding respectively to the alignment marks;
determining the product measuring sites according to the alignment marks; and
placing a monitor wafer, a projection of the monitor wafer in a vertical direction being aligned with and coinciding with the product wafer.

To solve the above-mentioned problem, also provided in the present application is a measuring apparatus, which includes:
a first carrying structure for carrying and fixing a product wafer, the product wafer having several alignment marks and product measuring sites corresponding respectively to the alignment marks;
a second carrying structure for carrying a monitor wafer, a projection of the monitor wafer located on the second carrying structure, in a vertical direction, being aligned with and coinciding with the product wafer located on the first carrying structure; and
a measuring module for measuring the monitor wafer after the product measuring sites are determined according to the alignment marks.

DESCRIPTION OF EMBODIMENTS

The embodiments of the monitor wafer measuring method and measuring apparatus according to the present application will be described in details below in conjunction with the accompanying drawings.

Figure 1:
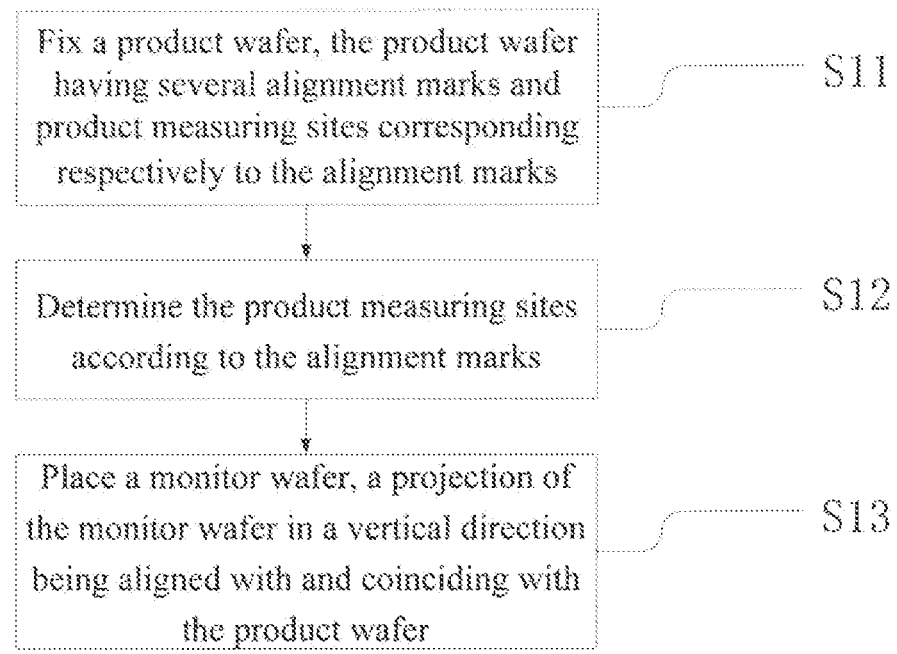
FIG. 1 is a flow chart illustrating a monitor wafer measuring method in the embodiments of the present application.
Figure 2:
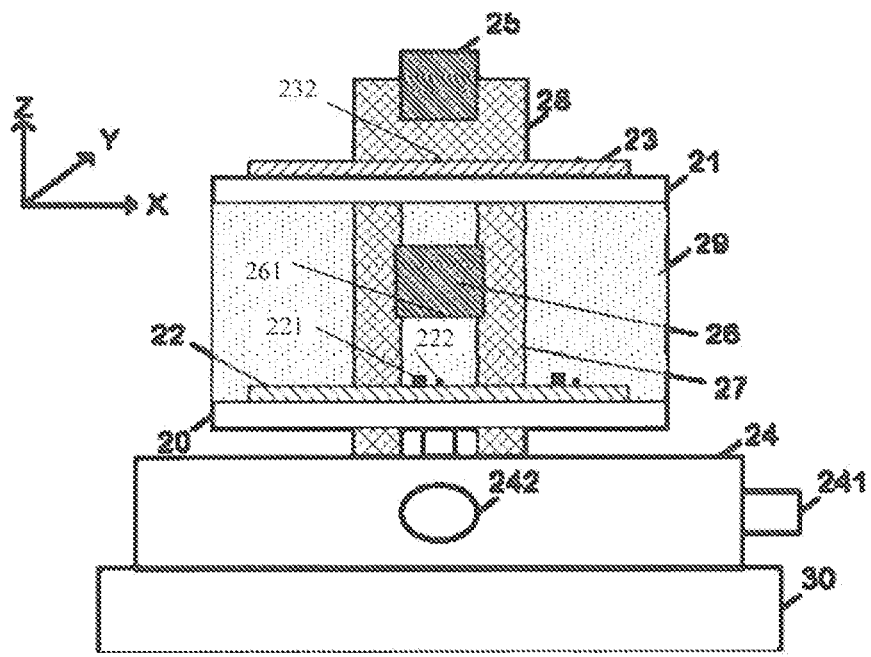
FIG. 2 is a schematic structural diagram of a measuring apparatus in the embodiments of the present application.

Provided in this embodiment of the present invention is a monitor wafer measuring method. FIG. 1 is a flow chart illustrating a monitor wafer measuring method in the embodiments of the present application, FIG. 2 is a schematic structural diagram of a measuring apparatus in the embodiments of the present application, and the monitor wafer measuring method as shown in FIG. 1 may be applied to the measuring apparatus as illustrated in FIG. 2. As shown in FIG. 1 and FIG. 2, the monitor wafer measuring method according to this embodiment includes the following steps.

Step S11: fixing a product wafer 22, the product wafer 22 having several alignment marks 221 and product measuring sites 222 corresponding respectively to the alignment marks 221.

In particular, the product wafer 22 is used as a reference system for positioning a monitor wafer. While positioning, the product wafer 22 remains unchanged with respect to a carrying surface inside the measuring apparatus for carrying the product wafer. With the measuring apparatus shown in FIG. 2 as an example, a first carrying structure 20 in the measuring apparatus is configured for carrying the product wafer 22. While the product wafer 22 is utilized as the reference system for positioning a monitor wafer, the product wafer 22 remains unchanged with respect to the position of the first carrying structure. The first carrying structure 20 may be, but not limited to, a chuck.

There may be one or a plurality of alignment marks 221 on the product wafer 22. The number of the alignment marks 221 may be chosen by those skilled in the art based on actual needs, e.g., based on the number of measuring sites to be measured on the monitor wafer. "A/the plurality of" mentioned in this embodiment refers to two and more than two. The specific shapes of the alignment marks 221 can be set by those skilled in the art, as actually required. When there are a plurality of alignment marks 221 on the product wafer 22, the shapes of the plurality of alignment marks 221 could be different, in order to facilitate identification for different measuring sites to be measured on the monitor wafer.

Step S12: determining the product measuring sites 222 according to the alignment marks 221.

Step S13: placing a monitor wafer 23, a projection of the monitor wafer 23 in a vertical direction being aligned with and coinciding with the product wafer 22.

The projection of the monitor wafer 23 in the vertical direction being aligned with and coinciding with the product wafer 22 means that, after the product wafer 22 and the monitor wafer 23 are fixed, the projection of the monitor wafer 23 in the vertical direction coincides completely with the product wafer 22. The measuring apparatus shown in FIG. 2 is still taken as an example. A second carrying structure 21 in the measuring apparatus is configured for carrying the monitor wafer 23. When the monitor wafer 23 is fixed to the second carrying structure 21, the projection of the monitor wafer 23 in a Z-axis direction is aligned with and coincides with the product wafer 22 located on the first carrying structure 20. Defining a relative position relationship between the monitor wafer 23 and the product wafer 22 facilitates subsequent measurement for the monitor wafer 23 by taking the product wafer 22 as the reference system. The second carrying structure 21 may be, but not limited to, a chuck.

In particular, after the product measuring sites 222 on the product wafer 22 are determined according to the alignment marks 221, i.e., positional alignment of the product wafer 22 on the measuring apparatus is realized, the product wafer 22 can then be measured directly. When the monitor wafer 23 is placed, it is ensured that the projection of the monitor wafer 23 in the vertical direction is aligned with and coincides with the product wafer 22. Due to the alignment of the position of the product wafer 22 on the measuring apparatus, the alignment of the corresponding monitor wafer 23 on the measuring apparatus is also attained, which is to say, the alignment for the measuring position of the monitor wafer 23 is achieved by the product wafer 22.

Alternatively, the method, after placing the monitor wafer 23, further includes:
measuring the monitor wafer 23 directly.

In particular, when the measuring sites to be measured on the monitor wafer 23 are corresponding to the product measuring sites 222 determined on the product wafer 22, the monitor wafer 23 can be measured directly since the projection of the monitor wafer 23 in the vertical direction is aligned with and coincides with the product wafer 22.

Alternatively, the monitor wafer 23 has a plurality of measuring sites to be measured thereon, the plurality of product measuring sites 222 are in one-to-one correspondence with the plurality of measuring sites to be measured; the method, after placing the monitor wafer, further includes the following steps:
selecting a measuring site to be measured 232 as a target measuring site to be measured 232, and selecting a standard measuring site corresponding to the target measuring site to be measured 232 as a target standard measuring site, to take the alignment mark 221 corresponding to the target standard measuring site as a target alignment mark 221; and
measuring the target measuring site to be measured 232 according to the target alignment mark 221.

Alternatively, the step of measuring the target measuring site to be measured 232 according to the target alignment mark 221 includes:
judging whether the target alignment mark 221 is aligned with a predetermined position 261, and if so, measuring the target measuring site to be measured 232.

Alternatively, the step of judging whether the target alignment mark 221 is aligned with a predetermined position 261 includes:
judging, through an optical detection method, whether the target alignment mark 221 is aligned with the predetermined position 261.

Alternatively, the method further includes the following step:
judging whether the target alignment mark 221 is aligned with the predetermined position 261, and if not, moving the product wafer 22 and the monitor wafer 23 synchronously.

In particular, as shown in FIG. 2, a first measuring unit 26 and a first stage 27 connected with the first measuring unit 26 may also be provided in the measuring apparatus. The first measuring unit 26 is configured for judging, through an optical detection method, whether the target alignment mark 221 is aligned with the predetermined position 261. The first stage 27 extends in a vertical direction (i.e., Z-axis direction in FIG. 2), the first measuring unit 26 may move in the extension direction (i.e., Z-axis direction) of the first stage 27, and accordingly the distance between the first measuring unit 26 and the first stage 27 is adjusted to obtain a clear alignment mark 221 image. The first stage 27 and the first measuring unit 26 are invariable in their positions. The predetermined position 261 is a detection position for the first measuring unit 26.

The product measuring sites 222 on the product wafer 22 are in one-to-one correspondence with the measuring sites to be measured on the monitor wafer 23, and for each product measuring site 222 on the product wafer 22, an alignment mark 221 corresponding thereto is set. After one measuring site to be measured 232 on the monitor wafer 23 is selected as the target measuring site to be measured 232, the target alignment mark 221 corresponding to the target measuring site to be measured 232 can be obtained in accordance with a corresponding relationship among the measuring site to be measured 232, the standard measuring site and the alignment mark 221. Subsequently, the positions of the product wafer 22 and the monitor wafer 23 inside the measuring apparatus can be corrected by identifying the target alignment mark 221 via the first measuring unit 26. For example, when the first measuring unit 26 does not detect the target alignment mark 221, it is confirmed that the target alignment mark 221 is not aligned with the predetermined position 261, and the product wafer 22 and the monitor wafer 23 are moved synchronously until the first measuring unit 26 can detect the complete target alignment mark 221.

Alternatively, the monitor wafer measuring method further includes the following steps:
providing a measuring component for measuring the monitor wafer 23;
acquiring a spacing between each standard measuring site and the alignment mark 221 corresponding thereto;
moving the product wafer 22 and the monitor wafer 23 synchronously according to the spacing between the target alignment mark 221 and the target standard measuring site when it is confirmed that the target alignment mark 221 is aligned with the predetermined position 261, such that the target measuring site to be measured 232 is aligned with the measuring component; and measuring the target measuring site to be measured 232 through the measuring component.

In particular, after the position of the monitor wafer 23 is corrected through the alignment mark 221 on the product wafer 22, in order to ensure that the direction and distance of movement of the monitor wafer 23 are the same as the direction and distance of movement of the product wafer 22 and further that there is high measurement accuracy at the target measuring site to be measured 232 on the monitor wafer 23, it is required to move the product wafer 22 and the monitor wafer 23 synchronously.

Alternatively, the step of placing a monitor wafer 23 includes:

fixing a monitor wafer 23 above the product wafer 22, such that a projection of the monitor wafer 23 in a vertical direction is aligned with and coincides with the product wafer 22.

Alternatively, the step of moving the product wafer 22 and the monitor wafer 23 synchronously includes:

providing a first carrying structure 20 and a second carrying structure 21 located above the first carrying structure 20, the first carrying structure 20 being configured for carrying and fixing the product wafer 22, the second carrying structure 21 being configured for carrying and fixing the monitor wafer 23, the first carrying structure 20 and the second carrying structure 21 being connected to a same moving structure 24; and synchronously driving the first carrying structure 20 and the second carrying structure 21 to move through the moving structure 24.

For example, as shown in FIG. 2, the measuring apparatus includes a pedestal 30 and the moving structure 24 is arranged on the pedestal 30. The first carrying structure 20 is arranged above the moving structure, the second carrying structure 21 is arranged above the first carrying structure 20, the first carrying structure 20 and the second carrying structure 21 are connected through a connecting structure 29, and the first carrying structure 20 is connected with the moving structure 24. The moving structure 24 includes a first driving portion 241 and a second driving portion 242. The first driving portion 241 is configured for driving the first carrying structure 20 to move in a first horizontal direction (e.g., X-axis direction), while causing, through the connecting structure 29, the second carrying structure 21 to move synchronously in the first horizontal direction. The second driving portion 242 is configured for driving the first carrying structure 20 to move in a second horizontal direction (e.g., Y-axis direction), while causing, through the connecting structure 29, the second carrying structure 21 to move synchronously in the second horizontal direction. The first horizontal direction is perpendicular to the second horizontal direction.

This embodiment involves arranging the first carrying structure 20 below the second carrying structure 21. Also, those skilled in the art may adjust, as actually required, the relative position relationship between the first carrying structure 20 and the second carrying structure 21, e.g., the first carrying structure 20 is arranged above the second carrying structure 21.

When a plurality of monitor wafers are measured or a plurality of measuring sites to be measured on one monitor wafer are measured, the position of the product wafer acting as the reference system is unchanged, in order to ensure the accuracy and comparability of measurement results. However, when the first carrying structure for carrying the product wafer or the moving structure connected with the first carrying structure is replaced due to hardware issues, recalibration is desired for the position of the product wafer. The method for calibrating the position of the product wafer may involve setting a calibration mark on the product wafer and then adjusting the position of the product wafer by identifying the calibration mark.

Furthermore, also provided in this embodiment is a measuring apparatus, and FIG. 2 is a schematic structural diagram of the measuring apparatus in the embodiments of the present application. The measuring apparatus according to this embodiment may measure a monitor wafer using the method as shown in FIG. 1. As illustrated in FIG. 2, the measuring apparatus includes:

a first carrying structure 20 for carrying and fixing a product wafer 22, the product wafer 22 having several alignment marks 221 and product measuring sites 222 corresponding respectively to the alignment marks 221;

a second carrying structure 21 for carrying and fixing a monitor wafer 23, a projection of the monitor wafer 23 located on the second carrying structure 21, in a vertical direction, being aligned with and coinciding with the product wafer 22 located on the first carrying structure 20; and a measuring module for measuring the monitor wafer 23 after the product measuring sites 222 are determined according to the alignment marks 221.

Alternatively, the monitor wafer 23 has a plurality of measuring sites to be measured thereon, the plurality of product measuring sites 222 are in one-to-one correspondence with the plurality of measuring sites to be measured;

the measuring module is further configured for judging whether a target alignment mark 221 is aligned with a predetermined position 261, the target alignment mark 221 is an alignment mark 221 corresponding to a target standard measuring site, the target standard measuring site is a standard measuring site corresponding to a target measuring site to be measured 232, and the target measuring site to be measured 232 is a measuring site to be measured 232 selected by a user.

Alternatively, the measuring module includes:

a first measuring unit 26 located above the first carrying structure 20, for judging whether the target alignment mark 221 is aligned with the predetermined position 261.

Alternatively, the measuring apparatus further includes:

a measuring component for measuring the monitor wafer 23;

the measuring module is further configured for acquiring a spacing between each standard measuring site and the alignment mark 221 corresponding thereto; when it is confirmed that the target alignment mark 221 is aligned with the predetermined position 261, the measuring module is further configured for moving the product wafer 22 and the monitor wafer 23 synchronously according to the spacing between the target alignment mark 221 and the target standard measuring site, such that the target measuring site to be measured 232 is aligned with the measuring component.

Alternatively, the first carrying structure 20 is located below the second carrying structure 21.

Alternatively, the second carrying structure 21 is further configured for carrying a semiconductor structure, the semiconductor structure having an identification mark therein;

a second measuring unit 25 located above the second carrying structure 21, for measuring the monitor wafer 23 and for judging whether the identification mark is aligned with the predetermined position 261.

In particular, the measuring apparatus further includes a second stage 28, the second stage 28 extends in a vertical direction (i.e., Z-axis direction), the second measuring unit 25 may move up and down along the second stage 28, so that the distance between the second measuring unit 25 and the semiconductor structure located above the second carrying structure 21 is adjusted to obtain a clear identification mark image. When the semiconductor structure (i.e., a process product) is measured, since the semiconductor structure itself has the identification mark, the identification mark on the semiconductor structure can be identified directly by the second measuring unit 25, so as to correct the position of the semiconductor structure without any correction through the product wafer.

Alternatively, the measuring apparatus further includes:
a connecting structure 29 located between the first carrying structure 20 and the second carrying structure 21, for connecting the first carrying structure 20 and the second carrying structure 21; and
a moving structure 24 located below and connected with the first carrying structure 20, for synchronously driving the first carrying structure 20 and the second carrying structure 21 to move.

In the monitor wafer measuring method and measuring apparatus according to this embodiment, measuring sites on a monitor wafer are determined by providing a product wafer having alignment marks 221 and identifying the alignment marks 221 on the product wafer while the monitor wafer is measured. That is, the product wafer is taken as a reference system, so that positional errors of the monitor wafer during the measurement process can be reduced or even eliminated, and product-level measuring position accuracy can be achieved for the monitor wafer.

What is claimed is:

1. A monitor wafer measuring method, comprising:
fixing a product wafer, the product wafer having alignment marks and product measuring sites corresponding respectively to the alignment marks;
determining the product measuring sites according to the alignment marks;
placing a monitor wafer, a projection of the monitor wafer in a vertical direction being aligned with and coinciding with the product wafer, wherein the monitor wafer has a plurality of measuring sites to be measured thereon, the product measuring sites are in one-to-one correspondence with the plurality of measuring sites to be measured;
selecting a measuring site to be measured as a target measuring site to be measured, and selecting a product measuring site corresponding to the target measuring site to be measured as a target product measuring site, to take an alignment mark corresponding to the target product measuring site as a target alignment mark;
judging, by a first measuring unit, whether the target alignment mark is aligned with a predetermined position, wherein the predetermined position is a detection position of the first measuring unit;
when the target alignment mark is aligned with the predetermined position, measuring the target measuring site to be measured; and
when the target alignment mark is not aligned with the predetermined position, moving the product wafer and the monitor wafer synchronously.

2. The monitor wafer measuring method according to claim 1, wherein the step of judging whether the target alignment mark is aligned with a predetermined position comprises:
detecting, through an optical method, whether the target alignment mark is aligned with the predetermined position.

3. The monitor wafer measuring method according to claim 1, further comprising:
providing a measuring component for measuring the monitor wafer;
acquiring a spacing between the product measuring site and the alignment mark corresponding thereto;
moving the product wafer and the monitor wafer synchronously according to the spacing between the target alignment mark and a target standard measuring site when it is confirmed that the target alignment mark is aligned with the predetermined position, such that the target measuring site to be measured is aligned with the measuring component; and
measuring the target measuring site to be measured through the measuring component.

4. The monitor wafer measuring method according to claim 3, wherein the step of placing a monitor wafer comprises:
fixing the monitor wafer above the product wafer, such that the projection of the monitor wafer in the vertical direction is aligned with and coincides with the product wafer.

5. The monitor wafer measuring method according to claim 4, wherein the step of moving the product wafer and the monitor wafer synchronously comprises:
providing a first carrying structure and a second carrying structure located above the first carrying structure, the first carrying structure being configured for carrying and fixing the product wafer, the second carrying structure being configured for carrying and fixing the monitor wafer, the first carrying structure and the second carrying structure being connected to a same moving structure; and
synchronously driving the first carrying structure and the second carrying structure to move through the moving structure.

6. A measuring apparatus, comprising:
a first carrying structure for carrying and fixing a product wafer, the product wafer having alignment marks and product measuring sites corresponding respectively to the alignment marks;
a second carrying structure for carrying a monitor wafer, a projection of the monitor wafer located on the second carrying structure, in a vertical direction, being aligned with and coinciding with the product wafer located on the first carrying structure, wherein the monitor wafer has a plurality of measuring sites to be measured thereon, the product measuring sites are in one-to-one correspondence with the plurality of measuring sites to be measured; and
a measuring module for measuring the monitor wafer after the product measuring sites are determined according to the alignment marks;
wherein the measuring module comprises a first measuring unit, and the first measuring unit is configured for judging whether a target alignment mark is aligned with a predetermined position; and when the target alignment mark is aligned with the predetermined position, measuring a target measuring site to be measured, and when the target alignment mark is not aligned with the predetermined position, moving the product wafer and the monitor wafer synchronously; wherein the predetermined position is a detection position of the first measuring unit, the target alignment mark is an alignment mark corresponding to a target standard measuring site, the target standard measuring site is a standard measuring site corresponding to the target measuring site to be measured, and the target measuring site to be measured is a measuring site to be measured selected by a user.

7. The measuring apparatus according to claim 6, wherein the measuring module is further configured for acquiring a spacing between each of the standard measuring sites and the alignment mark corresponding thereto; when it is confirmed that the target alignment mark is aligned with the predetermined position, the measuring module is further configured for moving the product wafer and the monitor wafer synchronously according to the spacing between the target alignment mark and the target standard measuring site, such that the target measuring site to be measured is aligned with a measuring component.

8. The measuring apparatus according to claim 7, wherein the first measuring unit is located above the first carrying structure, for measuring the product wafer and for judging whether the target alignment mark is aligned with the predetermined position.

9. The measuring apparatus according to claim 8, wherein the first carrying structure is located below the second carrying structure.

10. The measuring apparatus according to claim 9, wherein the second carrying structure is further configured for carrying a semiconductor structure, the semiconductor structure having an identification mark therein; the measuring module further comprises:
a second measuring unit located above the second carrying structure, for measuring the monitor wafer and for judging whether the identification mark is aligned with the predetermined position.

11. The measuring apparatus according to claim 6, further comprising:
a connecting structure located between the first carrying structure and the second carrying structure, for connecting the first carrying structure and the second carrying structure; and
a moving structure located below and connected with the first carrying structure, for synchronously driving the first carrying structure and the second carrying structure to move.

\* \* \* \* \*